(12) United States Patent
Fujino

(10) Patent No.: US 8,159,835 B2
(45) Date of Patent: Apr. 17, 2012

(54) LASER APPARATUS

(75) Inventor: Junji Fujino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 419 days.

(21) Appl. No.: 12/424,660

(22) Filed: Apr. 16, 2009

(65) Prior Publication Data

US 2010/0165597 A1    Jul. 1, 2010

(30) Foreign Application Priority Data

Dec. 25, 2008    (JP) ................................ 2008-329680

(51) Int. Cl.
*H05K 5/02*    (2006.01)
(52) U.S. Cl. .......... 361/813; 361/690; 361/723; 257/79; 257/98; 257/99; 257/433; 257/666; 372/43.01
(58) Field of Classification Search .................. 361/813, 361/690, 723; 257/79, 98, 99, 433, 666; 372/43.01
See application file for complete search history.

(56) References Cited

U.S. PATENT DOCUMENTS

| | | | | |
|---|---|---|---|---|
| 5,309,460 A | * | 5/1994 | Fujimaki et al. | 372/36 |
| 5,557,116 A | * | 9/1996 | Masui et al. | 257/100 |
| 5,878,069 A | * | 3/1999 | Kamibayashi et al. | 372/36 |
| 6,885,076 B2 | * | 4/2005 | Honda et al. | 257/433 |
| 6,912,333 B2 | | 6/2005 | Mikawa et al. | |
| 2002/0027265 A1 | * | 3/2002 | Yoneda et al. | 257/666 |
| 2005/0074043 A1 | * | 4/2005 | Yamamoto | 372/43 |
| 2006/0060877 A1 | * | 3/2006 | Edmond et al. | 257/99 |
| 2006/0118800 A1 | * | 6/2006 | Kim | 257/98 |
| 2006/0124939 A1 | * | 6/2006 | Lee et al. | 257/79 |
| 2007/0181900 A1 | * | 8/2007 | Sato et al. | 257/99 |
| 2008/0106999 A1 | * | 5/2008 | Fukumoto et al. | 369/121 |
| 2008/0217640 A1 | * | 9/2008 | Suzuki et al. | 257/98 |
| 2009/0315061 A1 | * | 12/2009 | Andrews | 257/99 |

FOREIGN PATENT DOCUMENTS

| | | |
|---|---|---|
| JP | 2001-052364 A | 2/2001 |
| JP | 2002-043674 A | 2/2002 |
| JP | 2003-086883 A | 3/2003 |
| JP | 2004-031455 A | 1/2004 |
| JP | 2006-165542 A | 6/2006 |

* cited by examiner

*Primary Examiner* — Xiaoliang Chen
(74) *Attorney, Agent, or Firm* — Leydig, Voit & Mayer, Ltd

(57) ABSTRACT

A laser apparatus comprises: a lead frame comprising a first outer lead and a first inner lead connected to the first outer lead; mold resin that has a top surface, does not seal the first outer lead but does seal the first inner lead and cleaves part of the first inner lead exposed on the top surface; a sub-mount comprising a mounting surface and a back surface facing each other, the mounting surface facing the top surface of the mold resin and the back surface being not covered with the mold resin; and a laser element mounted on the mounting surface of the sub-mount and electrically connected to the exposed part of the first inner lead.

14 Claims, 8 Drawing Sheets

LASER APPARATUS

BACKGROUND OF THE INVENTION

1. Field of the Invention

The present invention relates to a low-cost laser apparatus with high heat dissipation efficiency and a manufacturing method thereof.

2. Background Art

There is proposed such a laser apparatus that a recessed part is formed in mold resin in which a lead frame is sealed and a laser element and a sub-mount are mounted in this recessed part (e.g., see Japanese Patent No. 3973348). In a conventional laser apparatus, a laser element and a sub-mount are mounted in a die pad section of the lead frame and electrically connected to an inner lead by wire bonding.

SUMMARY OF THE INVENTION

For the conventional laser apparatus, it is necessary to use a thick Cu lead frame to dissipate heat of the laser element to the back side via the die pad section. Furthermore, relatively thick Au plating needs to be applied to the outermost surface of the inner lead to execute wire bonding. The costs of the Cu lead frame and Au plating are increasing with soaring prices of Au and Cu in recent years.

The present invention has been implemented to solve the above-described problems and it is an object of the present invention to provide a low-cost laser apparatus with high heat dissipation efficiency and a manufacturing method thereof.

According to one aspect of the present invention, a laser apparatus comprises: a lead frame comprising a first outer lead and a first inner lead connected to the first outer lead; mold resin that has a top surface, does not seal the first outer lead but does seal the first inner lead and makes part of the first inner lead exposed on the top surface; a sub-mount comprising a mounting surface and a back surface facing each other, the mounting surface facing the top surface of the mold resin and the back surface being not covered with the mold resin; and a laser element mounted on the mounting surface of the sub-mount and connected to the exposed part of the first inner lead.

The present invention can realize a low-cost laser apparatus with high heat dissipation efficiency and a manufacturing method thereof.

Other and further objects, features and advantages of the invention will appear more fully from the following description.

DETAILED DESCRIPTION OF THE PREFERRED EMBODIMENTS

Embodiment 1

Figure 1:
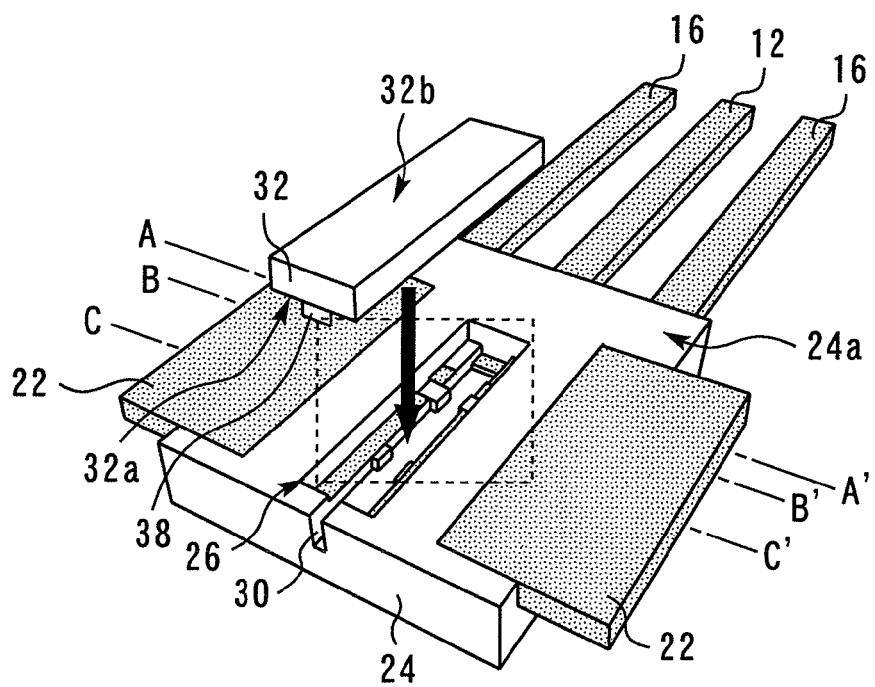
FIG. 1 is a perspective view showing a laser apparatus according to Embodiment 1.
Figure 2:
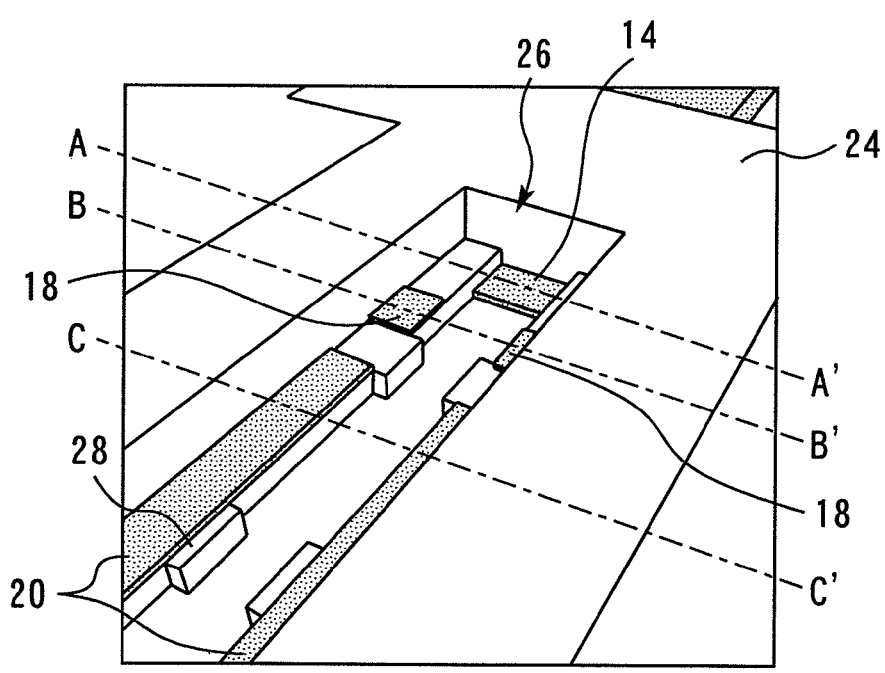
FIG. 2 is an enlarged view of the section enclosed by dotted line in FIG. 1.
Figure 3:
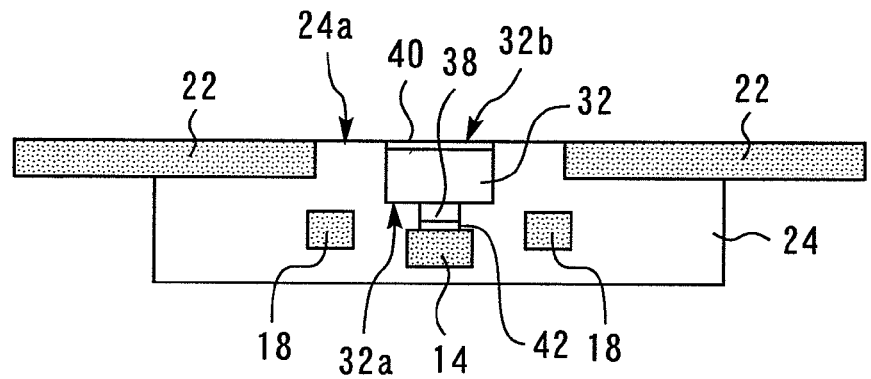
FIG. 3 is a cross-sectional view along A-A' of FIGS. 1 and 2.
Figure 4:
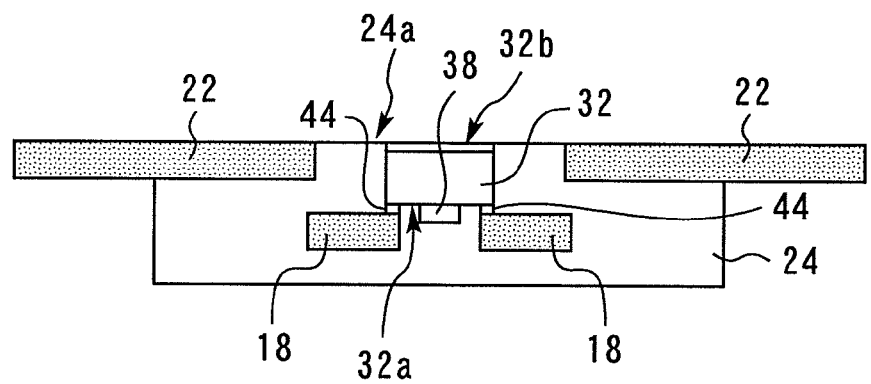
FIG. 4 is a cross-sectional view along B-B' of FIGS. 1 and 2.
Figure 5:
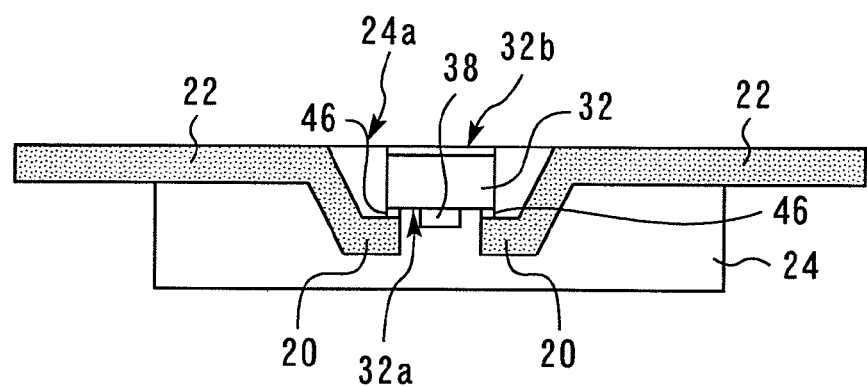
FIG. 5 is a cross-sectional view along C-C' of FIGS. 1 and 2.

FIG. 1 is a perspective view showing a laser apparatus according to Embodiment 1 and FIG. 2 is an enlarged view of the section enclosed by dotted line in FIG. 1. FIG. 3 is a cross-sectional view along A-A' of FIGS. 1 and 2 and FIG. 4 is a cross-sectional view along B-B' of FIGS. 1 and 2 and FIG. 5 is a cross-sectional view along C-C' of FIGS. 1 and 2.

Figure 6:
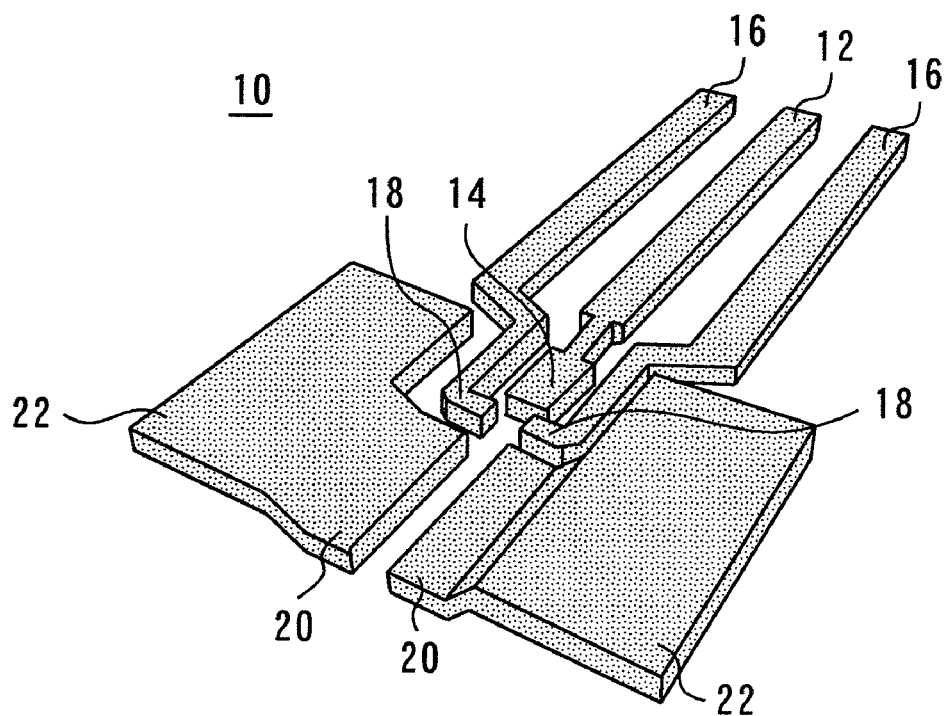
FIG. 6 is a perspective view showing the lead frame according to Embodiment 1.

FIG. 6 is a perspective view showing the lead frame according to Embodiment 1. The lead frame 10 has an outer lead 12 (first outer lead), an inner lead 14 (first inner lead) connected to the outer lead 12, outer leads 16 (second outer leads), inner leads 18 (second inner leads) connected to the outer leads 16, frames 20 and radiating fins 22 connected to the frames 20. The lead frame 10 is a low-cost, thin 42 alloy (e.g., 0.15 mm thick) molded through press work or the like. Ag plating is applied to the surface of the lead frame 10.

Mold resin 24 seals the inner leads 14, 18 and frame 20. However, the outer leads 12 and 16 are not sealed. A recessed part 26 is formed on a top surface 24a of the mold resin 24. Part of the inner leads 14 and 18, and part of the frames 20 are exposed from the recessed part 26 of this top surface 24a. Protrusions 28 are formed in the recessed part 26 of the mold resin 24 and a notch 30 is formed at an end of the recessed part 26.

Figure 7:
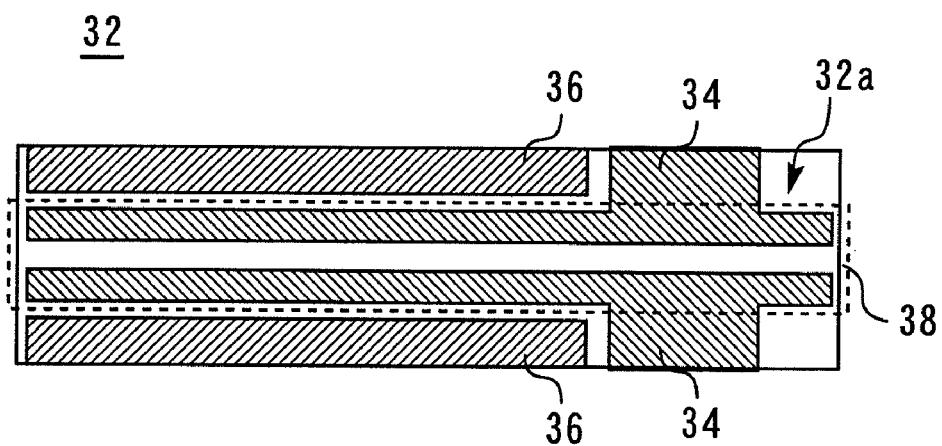
FIG. 7 is a perspective view showing a sub-mount according to Embodiment 1.

FIG. 7 is a perspective view showing a sub-mount according to Embodiment 1. The sub-mount 32 has a mounting surface 32a and a back surface 32b facing each other. Wiring patterns 34 and 36 are formed on the mounting surface 32a of the sub-mount 32. A laser element 38 is mounted on the mounting surface 32a of the sub-mount 32 and connected to the wiring pattern 34 with AuSn solder (melting point 280° C.) or the like.

A Cu film 40 (metal film) with excellent heat dissipation and having a thickness of 10 μm or more, for example, 200 μm is formed on the exposed back surface 32b of the sub-mount 32 through plating or brazing. The outermost surface is plated with Ni/Au.

The pre-bonded laser element 38 and sub-mount 32 are mounted face down in the recessed part 26 of the mold resin 24. That is, the mounting surface 32a of the sub-mount 32 faces the top surface 24a of the mold resin 24, and the laser element 38 and the sub-mount 32 are accommodated in the recessed part 26. However, the back surface 32b of the sub-mount 32 is not covered with the mold resin 24. In this condition, part of the laser element 38 and the exposed part of the inner lead 14 face each other and are bonded together via SnAgCu solder 42 (first conductive material). Part of the wiring pattern 34 and the exposed part of the inner leads 18 face each other and are bonded together via SnAgCu solder 44 (second conductive material). Part of the frames 20 is bonded to the wiring pattern 36 of the mounting surface 32a of the sub-mount 32 via SnAgCu solder 46.

The method of manufacturing the above-described laser apparatus will be explained. First, the lead frame 10 as shown in FIG. 6 is formed. Steps corresponding in thickness to the laser element 38 and sub-mount 32 are formed in this lead frame 10 through bending. Next, the inner leads 14, 18 and frames 20 are sealed with the mold resin 24. However, the outer leads 12 and 16 are not sealed. Furthermore, the recessed part 26 is formed on the top surface 24a of the mold resin 24 and part of the inner leads 14 and 18, and part of the frames 20 are exposed in the recessed part 26 of this top surface 24a.

Next, as shown in FIG. 7, the wiring patterns 34 and 36 are formed on the mounting surface 32a of the sub-mount 32. The laser element 38 is then mounted on the mounting surface 32a of the sub-mount 32 and connected to the wiring pattern 34.

Next, the SnAgCu solder 42 is supplied to part of the laser element 38, the SnAgCu solder 44 to part of the wiring pattern 34 and the SnAgCu solder 46 to the wiring pattern 36 of the sub-mount 32 respectively beforehand using vapor deposition or the like.

Next, the mounting surface 32a of the sub-mount 32 on which the laser element 38 is mounted is placed so as to face the top surface 24a of the mold resin 24. Part of the laser element 38 and the exposed part of the inner lead 14 are placed so as to face each other and bonded together via the SnAgCu solder 42. Part of the wiring pattern 34 and the exposed part of the inner leads 18 are made to face each other and bonded together via the SnAgCu solder 44. Part of the wiring pattern 36 and part of the frames 20 are made to face each other and bonded together via the SnAgCu solder 46. The laser apparatus according to the present embodiment is manufactured in these steps.

In the present embodiment, the laser element 38 is mounted on the mounting surface 32a of the sub-mount 32 and the back surface 32b facing the mounting surface 32a is exposed without being covered with the mold resin 24. Therefore, it is possible to dissipate heat of the laser element 38 without going through the lead frame 10. This avoids using a costly thick Cu lead frame, and can thereby reduce the manufacturing cost. Furthermore, it is possible to secure a heat dissipation path of small thermal resistance and thereby efficiently dissipate heat generated at the high output laser element 38, too. Therefore, a low-cost laser apparatus with good heat dissipation can be realized.

Furthermore, part of the laser element 38 and the exposed part of the inner lead 14 face each other and are bonded together via the SnAgCu solder 42 such as solder or conductive adhesive. Part of the wiring pattern 34 and the exposed part of the inner leads 18 face each other and are bonded together via the SnAgCu solder 44. This eliminates the necessity for wire bonding and the necessity for applying costly surface treatment such as Au plating to the inner lead 14 and inner leads 18. Therefore, it is possible to further reduce the manufacturing cost.

Moreover, the radiating fins 22 are connected to the mounting surface 32a of the sub-mount 32 on which the laser element 38 is mounted via the frames 20. This makes it possible to effectively use the mounting surface 32a of the sub-mount 32 which has not been conventionally used for heat dissipation and realize high heat dissipation.

Furthermore, forming the recessed part 26 in the mold resin 24 makes it easier to position and mount the laser element 38 and the sub-mount 32. It is also possible to protect the mounted laser element 38 and sub-mount 32.

Furthermore, the protrusions 28 contacting the laser element 38 are formed in the recessed part 26 of the mold resin 24. Thermally deforming the protrusions 28 during heating for soldering allows the protrusions 28 to constrain the laser element 38. This can increase the bonding strength and improve the reliability. The protrusions 28 may also be made to constrain the sub-mount 32.

Furthermore, supplying the SnAgCu solder 42 to part of the laser element 38 before bonding the laser element 38 to the inner lead 14 allows the SnAgCu solder 42 to melt and easily bond both parts during mounting and heating. It is thereby possible to secure high productivity. Likewise, supplying the SnAgCu solder 44 to part of the wiring pattern 34 before bonding the wiring pattern 34 to the inner leads 18 can obtain similar effects. A conductive adhesive, conductive adhesive film, Au stud bump or the like may also be used instead of the SnAgCu solder 42 or 44.

Furthermore, forming the Cu film 40 only on the back surface 32b of the exposed sub-mount 32 can secure high heat dissipation while suppressing the amount of Cu used to a minimum.

Embodiment 2

Figure 8:
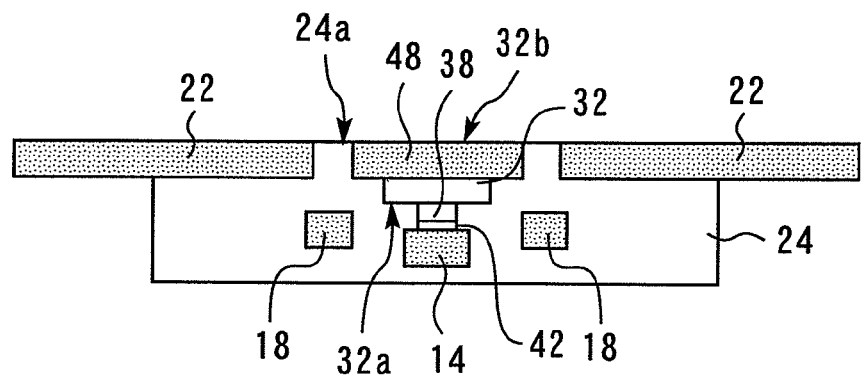
FIGS. 8 to 10 are cross-sectional views showing a laser apparatus according to Embodiment 2.
Figure 9:
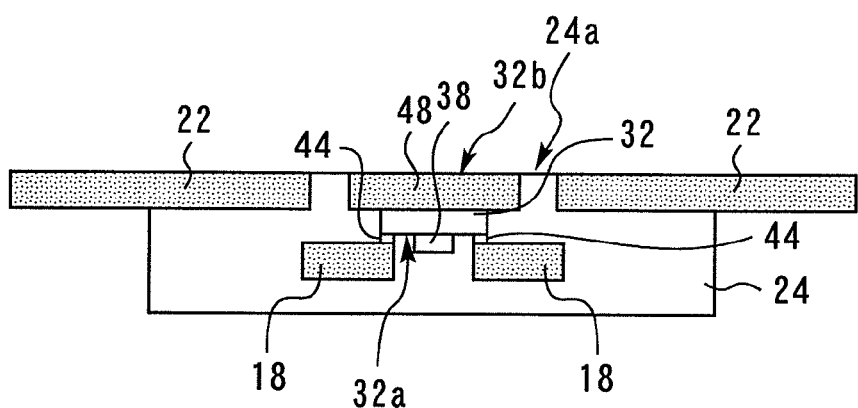
Figure 10:
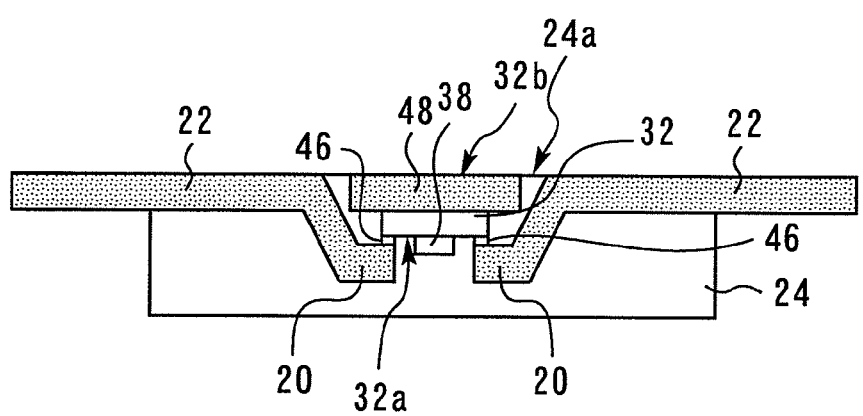

FIGS. 8 to 10 are cross-sectional views showing a laser apparatus according to Embodiment 2. These FIGS. 8 to 10 are cross-sectional views corresponding to FIGS. 3 to 5 of Embodiment 1.

A Cu plate 48 (metal plate) made of a member different from the lead frame 10 is bonded to the exposed back surface 32b of the sub-mount 32 instead of the Cu film 40 of Embodiment 1 through Ag brazing or Ti brazing. The rest of the configuration is the same as that of Embodiment 1.

This makes it possible to secure high heat dissipation while suppressing the amount of Cu used to a minimum. Soldering, welding or an adhesive may be used to bond the lead frame 10 of 42 alloy to the Cu plate 48.

Embodiment 3

Figure 11:
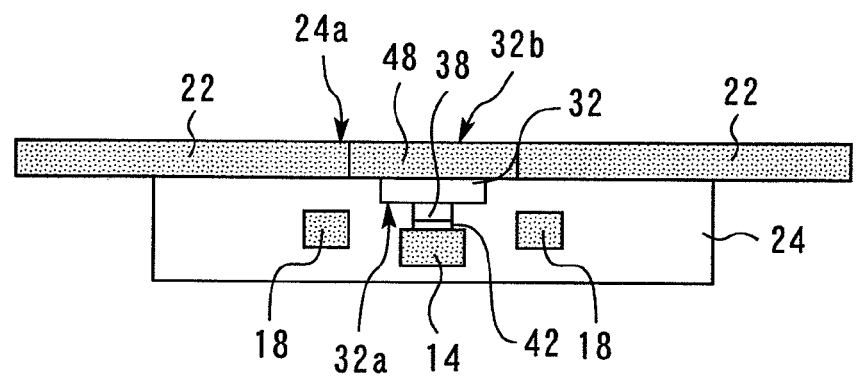
FIGS. 11 to 13 are cross-sectional views showing a laser apparatus according to Embodiment 3.
Figure 12:
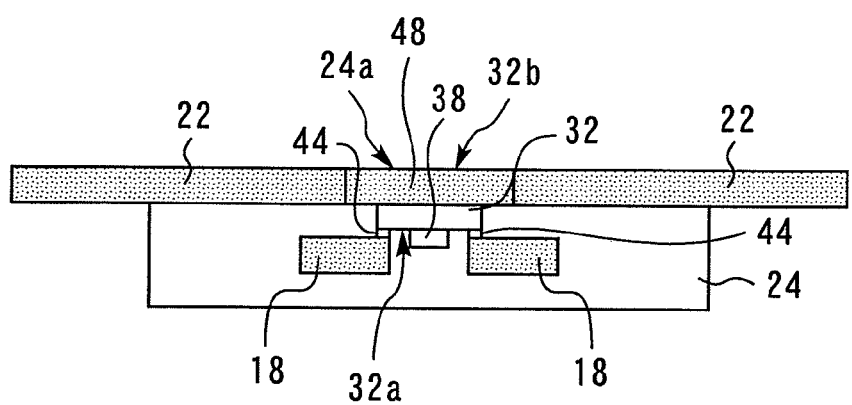
Figure 13:
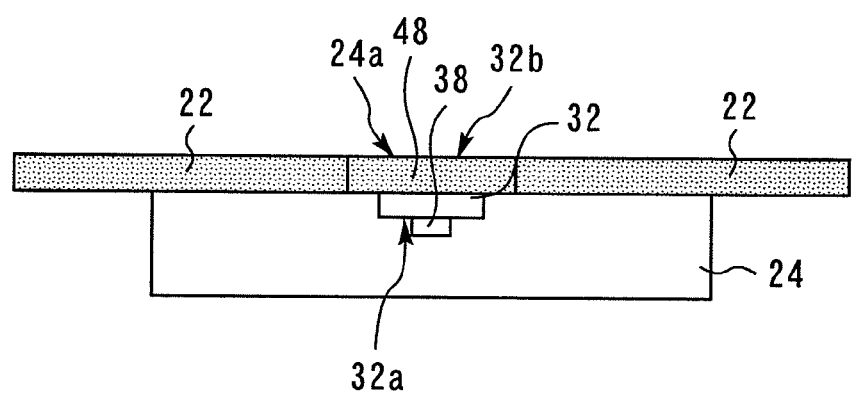

FIGS. 11 to 13 are cross-sectional views showing a laser apparatus according to Embodiment 3. These FIGS. 11 to 13 are cross-sectional views corresponding to FIGS. 3 to 5 of Embodiment 1 respectively. The Cu plate 48 (metal plate) is connected to the sides of the radiating fins 22. The rest of configuration is the same as that of Embodiment 2. This makes it possible to secure higher heat dissipation.

Embodiment 4

Figure 14:
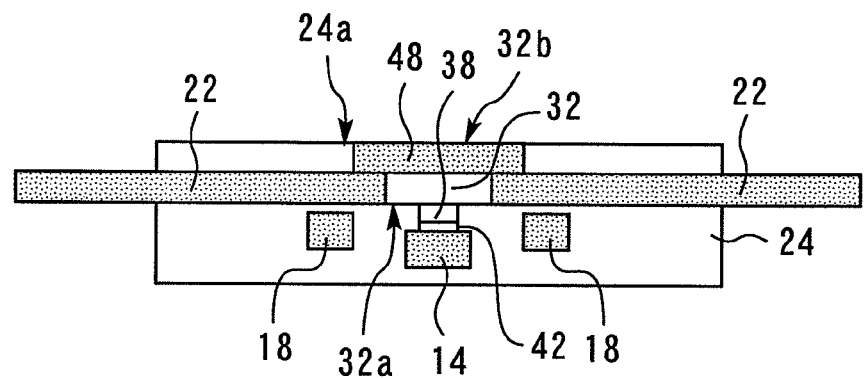
FIGS. 14 to 16 are cross-sectional views showing a laser apparatus according to Embodiment 4.
Figure 15:
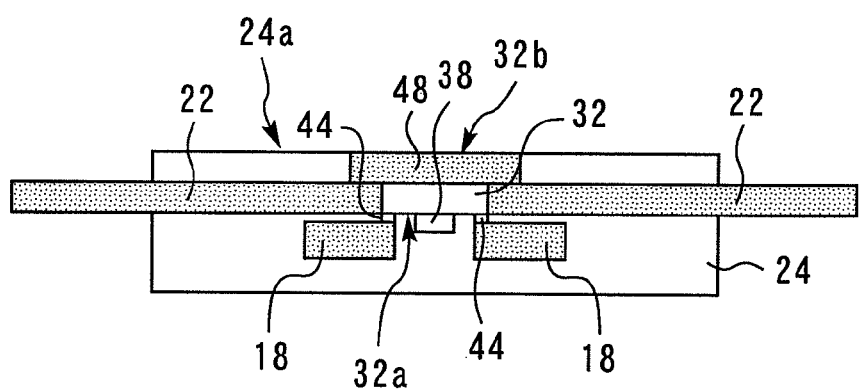
Figure 16:
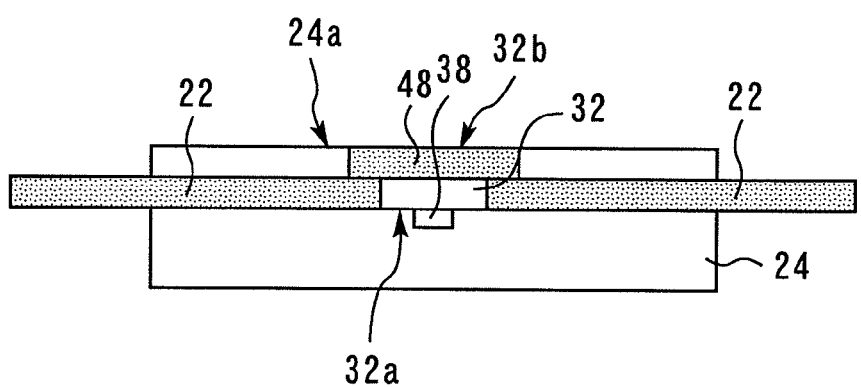

FIGS. 14 to 16 are cross-sectional views showing a laser apparatus according to Embodiment 4. These FIGS. 14 to 16 are cross-sectional views corresponding to FIGS. 3 to 5 of Embodiment 1 respectively. The Cu plate 48 is connected to the top surface of the radiating fin 22. The rest of the configuration is the same as that of Embodiment 3 and can obtain effects similar to those of Embodiment 3.

Embodiment 5

Figure 17:
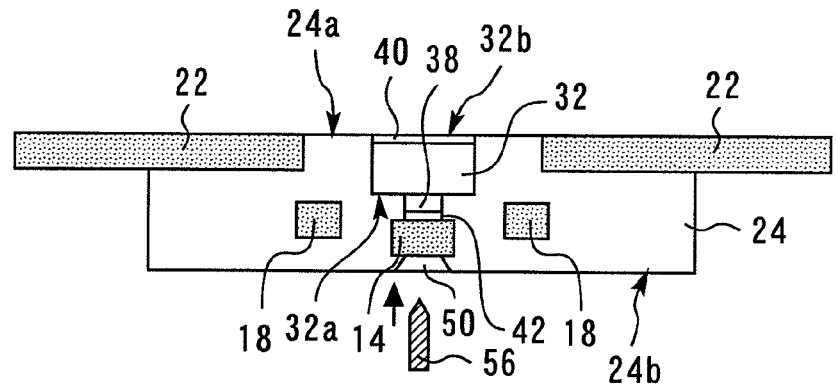
FIGS. 17 to 19 are cross-sectional views to illustrate a method of manufacturing a laser apparatus according to Embodiment 5.
Figure 18:
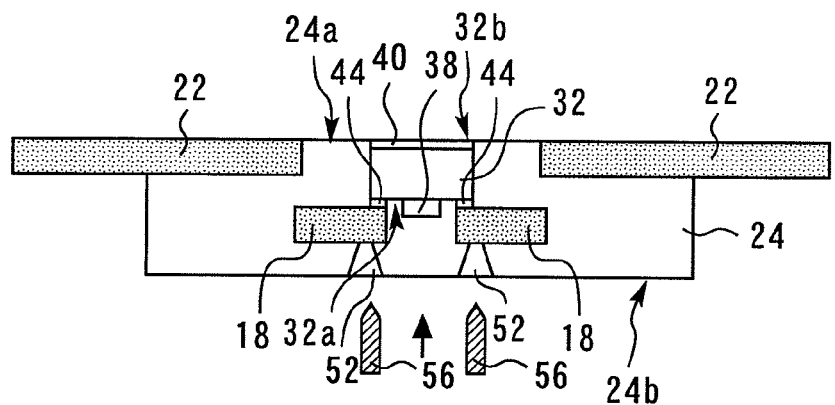
Figure 19:
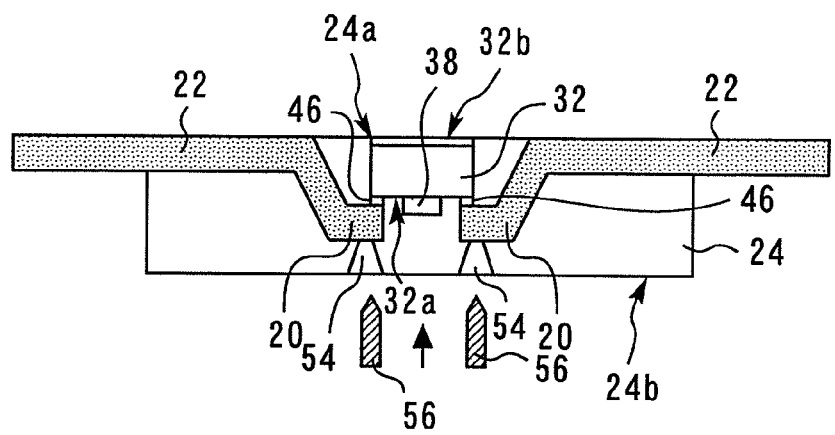

FIGS. 17 to 19 are cross-sectional views to illustrate a method of manufacturing a laser apparatus according to Embodiment 5. These FIGS. 17 to 19 are cross-sectional views corresponding to FIGS. 3 to 5 of Embodiment 1 respectively.

An opening 50 (first opening) that extends from an undersurface 24b facing the top surface 24a to the inner lead 14, openings 52 (second opening) that extend from the undersurface 24b to the inner leads 18 and openings 54 that extend from the undersurface 24b to the frames 20 are formed in the mold resin 24. When the laser element 38 and the inner lead 14 are bonded together, the inner lead 14 is deformed by a metal needle 56 that penetrates the opening 50 and pressed against the laser element 38. Likewise, when the wiring pattern 34 and the inner leads 18 are bonded together, the inner leads 18 are deformed by a metal needle 56 that penetrates the opening 52 and pressed against the wiring pattern 34. When the wiring pattern 36 and the frames 20 are bonded together, the frames 20 are deformed by a metal needle 56 that penetrates the opening 54 and pressed against the wiring pattern 36.

This makes it possible to absorb dimensional errors during manufacturing and satisfactorily connect the laser element 38 and the inner lead 14, the wiring pattern 34 and the inner leads 18, and the wiring pattern 36 and the frames 20 respectively. Furthermore, applying ultrasound through the metal needle 56 also allows bonding using an Au stud bump or the like.

Embodiment 6

Figure 20:
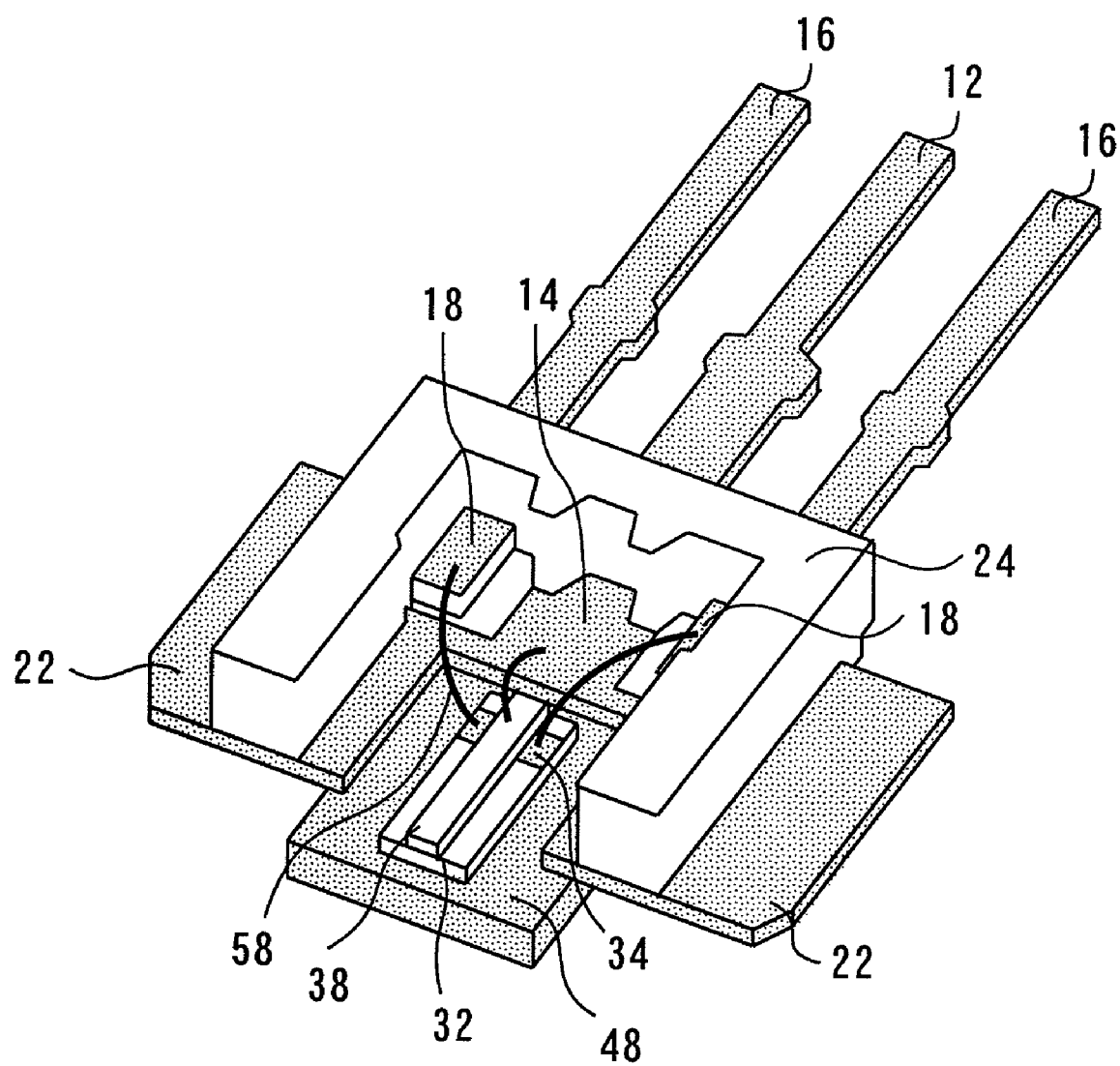
FIG. 20 is a perspective view showing a laser apparatus according to Embodiment 6.

FIG. 20 is a perspective view showing a laser apparatus according to Embodiment 6. As in the case of the conventional laser apparatus, the laser element 38 and the inner lead 14, and the wiring pattern 34 on the sub-mount 32 and the inner leads 18 are connected via wires 58 respectively. However, as in the case of Embodiment 1, the Cu plate 48 is disposed only right below the sub-mount 32 requiring heat dissipation and the lead frame 10 made of a low-cost, thin 42 alloy is used for other parts. This makes it possible to realize a low-cost laser apparatus with high heat dissipation.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-329680, filed on Dec. 25, 2008 including specification, claims, drawings and summary, on which the Convention priority of the present application is based, are incorporated herein by reference in its entirety.

What is claimed is:

1. A laser apparatus comprising:
a lead frame comprising a first outer lead and a first inner lead that is connected to the first outer lead;
a molded resin that has a surface, wherein the molded resin does not cover the first outer lead,
covers part of the first inner lead, and
leaves part of the first inner lead exposed on the surface of the molded resin;
a sub-mount comprising a mounting surface and a back surface, opposite the mounting surface, wherein
the mounting surface of the sub-mount faces the surface of the molded resin, and
the back surface of the sub-mount is not covered with the molded resin;
a laser element mounted on the mounting surface of the sub-mount, located between the surface of the molded resin and the mounting surface of the sub-mount, and electrically connected to the part of the first inner lead that is exposed on the surface of the molded resin; and
an electrically conductive material bonding together part of the laser element and the part of the first inner lead that is exposed on the surface of the molded resin, wherein the part of the laser element and the part of the first inner lead that is exposed on the surface of the molded resin that are bonded together, and the mounting surface of the sub-mount and the first inner lead face each other.

2. The laser apparatus according to claim 1, wherein
the lead frame further comprises a frame and a radiating fin connected to the frame, and
part of the frame is exposed from the molded resin and is electrically connected to the mounting surface of the sub-mount.

3. The laser apparatus according to claim 1, further comprising a metal film at least 10 μm thick and disposed on the back surface of the sub-mount.

4. The laser apparatus according to claim 1, further comprising a metal plate bonded to the back surface of the sub-mount.

5. The laser apparatus according to claim 2, further comprising a metal plate bonded to the back surface of the sub-mount, wherein the metal plate is thermally connected to the radiating fin.

6. The laser apparatus according to claim 1, wherein
the molded resin includes a recess and the surface of the molded resin is located within the recess,
the part of the first inner lead that is exposed on the surface of the molded resin is exposed in the recess, and
the laser element and the sub-mount are located within the recess.

7. The laser apparatus according to claim 6, wherein the molded resin includes a protrusion protruding into the recess for constraining movement of at least one of the laser element and the sub-mount in the recess.

8. A laser apparatus comprising:
a lead frame comprising a first outer lead and a first inner lead that is connected to the first outer lead;
a molded resin that has a surface, wherein the molded resin does not cover the first outer lead,
covers part of the first inner lead, and
leaves part of the first inner lead exposed on the surface of the molded resin;
a sub-mount comprising a mounting surface and a back surface, opposite the mounting surface, wherein
the mounting surface of the sub-mount faces the surface of the molded resin, and
the back surface of the sub-mount is not covered with the molded resin;
a laser element mounted on the mounting surface of the sub-mount, located between the surface of the molded resin and the mounting surface of the sub-mount, and electrically connected to the part of the first inner lead that is exposed on the surface of the molded resin; and
an electrically conductive material wherein
the lead frame further comprises
a second outer lead, and
a second inner lead that is connected to the second outer lead,
the sub-mount includes a wiring pattern on the mounting surface of the sub-mount,
the laser element is electrically connected to the wiring pattern,
the molded resin
does not cover the second outer lead,
covers part of the second inner lead, and
leaves part of the second inner lead exposed on the surface of the molded resin, and
part of the wiring pattern and the part of the second inner lead that is exposed on the surface of the molded resin are bonded together via the electrically conductive material.

9. The laser apparatus according to claim 8, wherein
the lead frame further comprises a frame and a radiating fin connected to the frame, and part of the frame is exposed from the molded resin and is electrically connected to the mounting surface of the sub-mount.

10. The laser apparatus according to claim 8, further comprising a metal film at least 10 μm thick and disposed on the back surface of the sub-mount.

11. The laser apparatus according to claim 8, further comprising a metal plate bonded to the back surface of the sub-mount.

12. The laser apparatus according to claim 9, further comprising a metal plate bonded to the back surface of the sub-mount, wherein the metal plate is thermally connected to the radiating fin.

13. The laser apparatus according to claim 8, wherein
the molded resin includes a recess and the surface of the molded resin is located within the recess,
the part of the first inner lead that is exposed on the surface of the molded resin is exposed in the recess, and
the laser element and the sub-mount are located within the recess.

14. The laser apparatus according to claim 13, wherein the molded resin includes a protrusion protruding into the recess for constraining movement of at least one of the laser element and the sub-mount in the recess.

\* \* \* \* \*